United States Patent
Park

(10) Patent No.: US 7,485,578 B2
(45) Date of Patent: Feb. 3, 2009

(54) SEMICONDUCTOR DEVICE

(75) Inventor: Keun Soo Park, Gyeonggi-do (KR)

(73) Assignee: Dongbu HiTek Co. Ltd., Seoul (KR)

( * ) Notice: Subject to any disclaimer, the term of this patent is extended or adjusted under 35 U.S.C. 154(b) by 34 days.

(21) Appl. No.: 11/617,057

(22) Filed: Dec. 28, 2006

(65) Prior Publication Data

US 2007/0155175 A1    Jul. 5, 2007

(30) Foreign Application Priority Data

Dec. 29, 2005    (KR)    ...................... 10-2005-0134361

(51) Int. Cl.
*H01L 21/44*    (2006.01)
*H01L 23/48*    (2006.01)

(52) U.S. Cl. ...................... 438/675; 438/627; 438/639; 257/750; 257/763

(58) Field of Classification Search ................ 438/629, 438/627, 637, 639, 672, 675, 648; 257/750, 257/751, 752, 763

See application file for complete search history.

(56) References Cited

U.S. PATENT DOCUMENTS

| 6,180,517 | B1 * | 1/2001 | Liou et al. | ................... 438/639 |
| 6,274,497 | B1 * | 8/2001 | Lou | ........................... 438/687 |
| 6,509,267 | B1 * | 1/2003 | Woo et al. | ................... 438/687 |
| 6,812,140 | B2 * | 11/2004 | Chang et al. | ................ 438/637 |

* cited by examiner

*Primary Examiner*—Kevin M Picardat
(74) *Attorney, Agent, or Firm*—Sherr & Vaughn, PLLC

(57) ABSTRACT

Embodiments relate to a semiconductor device and a method of fabricating semiconductor device, that may uniformly form a barrier layer in a via hole to thus prevent layers from being broken. In embodiments, a method of fabricating a semiconductor device may include forming an interlayer dielectric layer on a substrate, forming via holes selectively on the interlayer dielectric layer, forming a first metal layer on a top surface of the substrate including inner portion of the via hole, forming spacers on sides of the via holes by etching back the first metal layer, forming a second metal layer on the substrate including the spacer, and forming a tungsten layer by depositing tungsten on the second metal layer.

21 Claims, 2 Drawing Sheets

SEMICONDUCTOR DEVICE

The present application claims priority under 35 U.S.C. 119 and 35 U.S.C. 365 to Korean Patent Application No. 10-2005-0134361 (filed on Dec. 29, 2005), which is hereby incorporated by reference in its entirety.

BACKGROUND

As semiconductor devices become more highly-integrated and operate at higher speeds, metal interconnections formed in the semiconductor device may become micro-sized and multi-layered.

Such metal interconnections may be formed by exposing and developing a photoresist film to make a photoresist film pattern, and then etching the metal layer, for example using photoresist film pattern as a mask. In addition, to reduce a signal delay caused by low resistance and capacitance of the metal interconnection, copper may be used.

Copper may rarely be etched as compared with other metals. Thus, to make a copper interconnection, a damascene process may be performed. In a damascene process, a trench may be formed and a copper layer may be formed to fill the trench. Chemical mechanical polishing may then be performed relative to the copper layer. Similar to the copper interconnection, a plug, which may be used to interconnect multi-layered metal interconnections, may also be formed by filling a via hole with tungsten, etc.

When forming a copper interconnection or a tungsten plug, a barrier layer may be necessary to prevent a metal from diffusing into other layers, and may enhance a bonding property relative to an insulating layer.

An interlayer dielectric layer, however, may have a certain amount of moisture. The moisture contained in the interlayer dielectric layer may be exhausted when forming the barrier layer at a high temperature. This may cause the barrier layer to be irregularly formed.

In addition, if the barrier layer is irregularly formed, a diffusion of metal may occur when the metal layer is filled in the via hole at a high temperature. Thus, a material forming the plug, such as tungsten, may not be easily introduced into the via hole, but may block an inlet of the via hole (which is called "overhanging"). Also, tungsten may be stacked up only around the inlet of the via hole.

Moreover, if the barrier layer is weakly formed, aluminum of the barrier layer's lower part may be discharged. Diffusion of metal may occur if a metal layer is formed by tungsten, etc. Aluminum (Al) in the barrier layer may react with fluorine of WF6 gas, which may be source material forming the plug. This may form AlF3. In addition, if AlF3 is discharged out of the via hole, the phenomenon of blocking introduction of W into the via hole in the process of W deposition may occur.

SUMMARY

Embodiments relate to a semiconductor device. Embodiments relate to a semiconductor device and a method of fabricating the same that may be capable of improving a reliability of a metal interconnection.

Embodiments relate to a semiconductor and a method of forming a semiconductor where a barrier layer may be uniformly formed without incurring overhanging. Embodiments relate to a semiconductor and a method of fabricating a semiconductor that may be capable of improving a reliability of a deposition process when a metal layer is filled in a via hole.

Embodiments relate to a semiconductor and a method of fabricating a semiconductor that may be capable of improving reliability of a metal interconnection by compensating for non-uniformity of via holes using a barrier layer.

Embodiments relate to a semiconductor and a method of fabricating a semiconductor that may be capable of improving the operation reliability and product yield of a semiconductor device.

According to embodiments, a semiconductor device may include a substrate, an insulating layer laminated on a top surface of the substrate, via holes formed in the insulating layer, in which a bottom surface of the via hole may make contact with the substrate, a barrier layer formed in the via hole, and a conductive material filled in the barrier layer. The barrier layer may include a spacer, formed in the via hole to make contact with the insulating layer including at least an inner edge of the via hole, and a metal layer formed on the spacer while being deposited on an entire surface of an inner portion of the via hole.

According to embodiments, a method of fabricating a semiconductor device may include depositing a first metal layer in an inner portion of a via hole, forming spacers on the inner portion of the via hole including at least an inner edge of the via hole by etching back the first metal layer, forming a second metal layer on a top surface of the substrate having the spacer, thereby forming a barrier layer including the first and second metal layers, and filling at least an inner portion of the via hole with a conductive material.

According to embodiments, a method of fabricating a semiconductor device may include forming an interlayer dielectric layer on a substrate, forming via holes selectively on the interlayer dielectric layer, forming a first metal Slayer on a top surface of the substrate including an inner part of the via hole, forming spacers on sides of the via holes by etching back the first metal layer, forming a second metal layer on the substrate including the spacer, and forming a tungsten layer by depositing tungsten on the second metal layer.

According to embodiments, the barrier layer may be uniformly formed in the via hole without causing a defect, and may improve a reliability of a deposition process performed in the via hole.

In addition, an operational reliability and product yield of a semiconductor device may be improved.

DETAILED DESCRIPTION OF EMBODIMENTS

Figure 1:
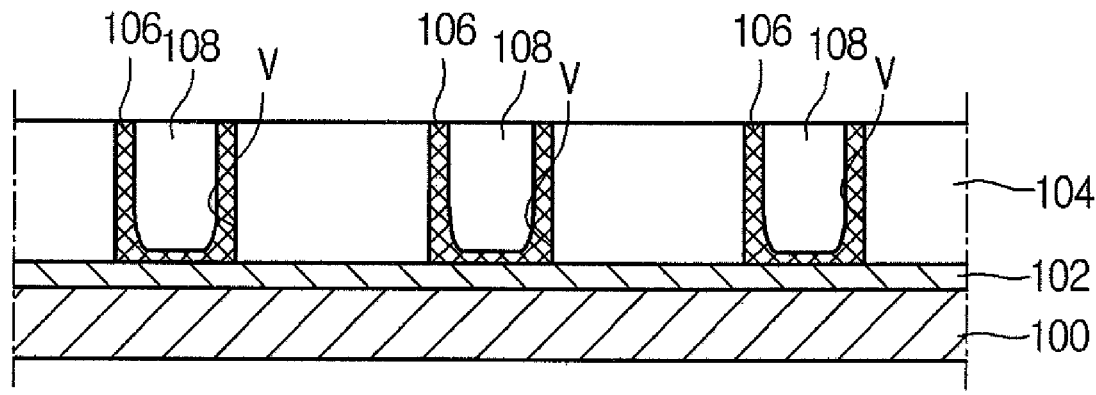
FIG. 1 is an example sectional diagram of a semiconductor device according to embodiments.

Referring to FIG. 1, first metal layer 102 may be formed on substrate 100. Substrate 100 may already be formed with other devices, such as individual devices (not shown) or a lower electric conductor (not shown). In embodiments, first metal layer 102 and the lower electric conductor may include copper (Cu), aluminum (Al), tungsten (W), silver (Ag), gold (Au), platinum (Pt), etc.

Interlayer dielectric layer 104, which may include a plurality of via holes V, may be formed on first metal layer 102. Interlayer dielectric layer 104 may be prepared in the form of a single layer or a multi-layer through laminating inorganic insulating materials or organic insulating materials such as FSG (fluorine silicate glass), USG (un-doped silicate glass), SiH4, TEOS (tetra ethyl ortho silicate), etc. In addition, interlayer dielectric layer 104 may be formed with a material having a low dielectric constant, such as BD (black diamond), which may have a dielectric constant of 3.0 or less.

Barrier layer 106 may be shallowly formed along the inner wall of via hole V. In addition, second metal layer 108 may be formed on barrier layer 106 and may fill via hole V. In embodiments, barrier layer 106 may include Ti, TiN, Ti/TiN, or Ti/Al/Ti, and second metal layer 108 may include tungsten (W).

According to embodiments, at an inner edge of via hole V, barrier layer 106 may be slightly more bulged than at an outer part thereof. Thus a lower portion may be thicker than an upper portion. As a result, a reliability of laminating of barrier layer 106 at the inner edge of via hole V may be improved. Therefore, a reliability of the metal layer deposition process in via hole V may be improved regardless of moisture exhaustion from the inner portion of interlayer dielectric layer 104 or Al discharged through the exposed portion of barrier layer 106. Thus, a reliability of a plug formed in via hole V and the reliability of the metal interconnection formed after the plug may be improved. As a result, reliability and product yield of a semiconductor device may be improved.

To form a bulged (i.e. protruding) portion at the inner edge on a predominantly lower portion of the barrier layer, the metal layer of barrier layer 106 may be formed repeatedly, for example at least two times. Such a method of fabricating the semiconductor device will be described with reference to FIG. 2 through FIG. 4.

Figure 2:
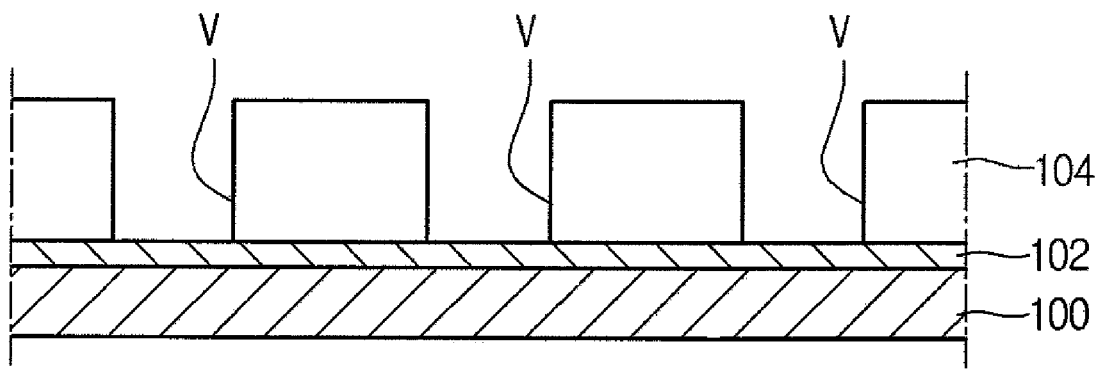
FIGS. 2 through 4 are example sectional diagrams illustrating a semiconductor device and a method of forming a metal interconnection of a semiconductor device according to embodiments.
Figure 3:
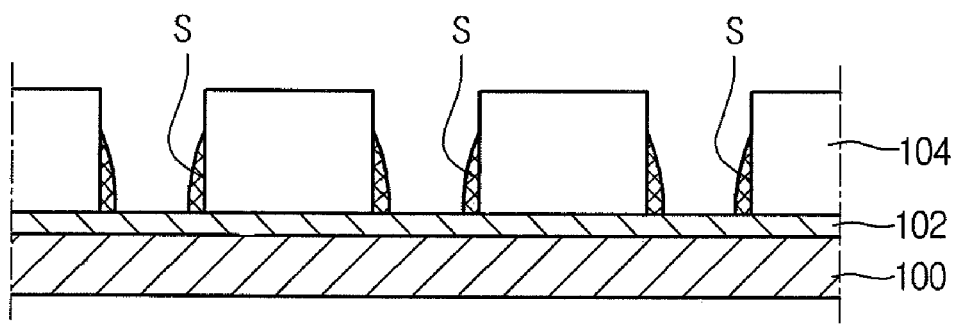
Figure 4:
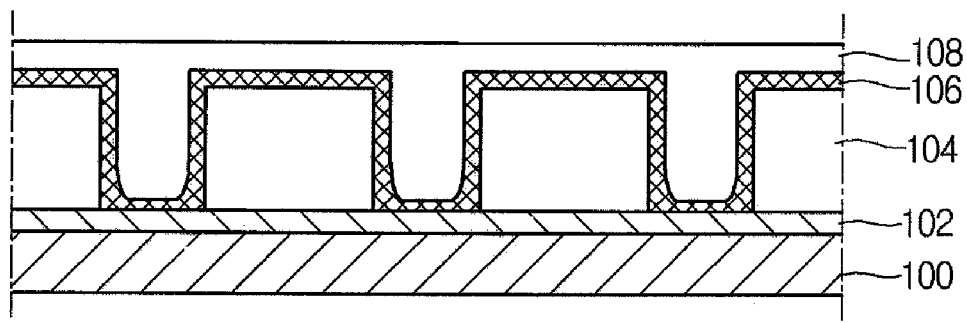

FIG. 2 through FIG. 4 are example sectional views sequentially illustrating a method of forming a metal interconnection of a semiconductor device according to embodiments.

Referring to FIG. 2, first metal layer 102 may be formed on substrate 100, for example through a photolithography or damascene process.

In addition, interlayer dielectric layer 104 may be formed on first metal layer 102. After that, a plurality of via holes V may be formed, for example by selectively exposing first metal layer 102 by performing a selective etching process relative to the interlayer dielectric layer 104, for example using a photoresist film or the like.

Next, the process of forming spacer S as shown in FIG. 3 may be performed.

To improve a reliability in formation of barrier layer 106, moisture contained in interlayer dielectric layer 104 may be removed. Then, a first metal layer may be formed on substrate 100 having via hole V, wherein a thickness of the first metal layer may be approximately 1400 Å. This may be thicker than a related art metal layer forming the barrier layer. The first metal layer may be etched back to form spacer S on the sidewalls of via holes V. A thickness of spacer S may be 50 Å or less.

The etch-back may be performed using an anisotropic etching process relative to the first metal layer while injecting approximately 120 sccm of SF6 and 120 sccm of Ar without a mask. Then, due to characteristics of the etch-back, when the first metal layer previously formed in the upper edge of via hole V is almost removed, some of the first metal layer at a lower edge of via hole V may remain. The remaining first metal layer, as shown in FIG. 3, may become spacer S.

According to embodiments, spacer S may prevent exhaustion into via hole V of remaining moisture that may remain without being removed in the moisture removing process performed before forming the first metal layer. Also, spacer S may serve to primarily planarize a prescribed potion of the inner portion of via hole V, which may non-uniformly remain after via hole V is formed in interlayer dielectric layer 104. Such a function of spacer S may enhance the reliability of a deposition process in via hole V in the subsequent processes.

Referring to FIG. 4, the second metal layer may be formed, for example through chemical vapor deposition on substrate 100 having spacer S. In embodiments, the second metal layer may include a material identical to a material forming spacer S, which may facilitate formation of barrier layer 106. According to embodiments, a moisture removing process may be additionally performed relative to interlayer dielectric layer 104 before depositing the second metal layer.

A thickness of the second metal layer may be in range of approximately 100 Å to 350 Å. A thickness of the second metal layer may be a half or less of the thickness of the first metal layer.

In embodiments, when depositing a layer through chemical vapor deposition in via hole V having a vertical length longer than the horizontal length, the layer may be easily deposited on the upper edge of the via hole, but may not be easily deposited on a lower edge of the via hole as compared with the upper edge of the via hole.

However, according to embodiments, the second metal layer may be deposited while the first metal layer having a prescribed thickness remains at the lower edge of the via hole in the form of spacer S. Thus, when forming the second layer through the second chemical vapor deposition, even if the layer deposited on the lower edge of via hole V is thinner than that deposited on the upper edge of via hole V, a uniform barrier layer 106, including the first metal layer and the second metal layer, may be formed in via hole V due to spacer S.

According to embodiments, a bulged (i.e. protruding) part may be provided at a lower, inner edge portion of via hole V. In addition, since the first metal layer and the second metal layer may be formed of the same material, the first metal layer may not be distinguished from the second metal layer, in embodiments.

According to embodiments, even if moisture exhausts from interlayer dielectric layer 104 due to the high temperature when forming the second metal layer, no more moisture can exhaust from a region where spacer S may have been formed, due to the presence of spacer S. Therefore, it may be possible to prevent defects of the second metal layer. That is, the second metal layer may be prevented from being disconnected or broken due to the effect of moisture. Thus, even when depositing tungsten in via hole V later, it may be possible to eliminate the effect of moisture in interlayer dielectric layer 104 or the effect of gas generated by the reaction between aluminum exposed from the barrier layer 106 and tungsten compound.

According to embodiments, tungsten may be deposited on barrier layer 106 using WF6 gas in such a manner that via hole V may be filled with the tungsten. This may form tungsten layer 108. In embodiments, it may be possible to prevent the exhaustion of gas caused by the interaction between the WF6 gas and Al, because the barrier layer 106 may be provided firmly and securely and reliably without defects. Therefore, the deposition of tungsten into via hole V may be more easily carried out.

Tungsten layer 108 may be planarized through chemical mechanical polishing, thereby forming metal layer 108 and barrier layer 106, as shown in FIG. 1.

In embodiments barrier layer 106 may be formed by performing an etch-back after forming the first metal layer, and the second metal layer may then be formed. In embodiments, formation of the metal layers may be consecutively performed more than twice, which may improve the reliability of the barrier layer.

Also, although embodiments have been described in which tungsten layer may be formed in via hole, according to embodiments, other metals that serve as conductors in the semiconductor device may also be formed in via hole.

According to embodiments, spacers may be formed at a lower edge of via hole V where the layer may rarely be formed when forming the barrier layer through chemical vapor deposition. The barrier layer may thus be uniformly formed.

In addition, since the exhaustion of moisture may be prevented at the lower edge of the barrier layer due to spacers, the barrier layer may be prevented from being broken by the exhaustion of moisture at the lower edge of the barrier layer. This may improve a reliability of a device. Also, leakage of gas caused by a chemical reaction derived from the exposure or defects of the barrier layer may be prevented, so that the barrier layer may be prevented from breaking.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a first metal layer over a substrate;
   forming an interlayer dielectric layer over the substrate including the first metal layer;
   forming a via hole in the interlayer dielectric layer exposing the first metal layer;
   forming a second metal layer in the via hole on sidewalls of the interlayer dielectric layer;
   forming spacers in the via hole and contacting at least a portion of the exposed first metal layer by etching back the second metal layer exposing a portion of the sidewalls of the interlayer dielectric layer;
   forming a third metal layer over the spacers and the exposed portion of the sidewalls of the interlayer dielectric layer and the exposed first metal layer; and
   forming a fourth metal layer by depositing a conductive metal over the third metal layer to fill the via hole.

2. The method of claim 1, wherein the fourth metal layer comprises tungsten.

3. The method of claim 1, further comprising planarizing the substrate having the fourth metal layer through chemical mechanical polishing.

4. The method of claim 1, wherein a thickness of the spacers is 50 Å or less.

5. The method of claim 1, wherein a thickness of the third metal layer is no more than half of a thickness of the second metal layer.

6. The method of claim 1, wherein a thickness of the third metal layer is in a range of 100 Å to 350 Å.

7. The method of claim 1, wherein the etching-back of the second metal layer is performed by injecting approximately 120 sccm of $SF_6$ and approximately 120 sccm of Ar.

8. The method of claim 1, wherein the third metal layer is formed through chemical vapor deposition.

9. The method of claim 1, wherein a thickness of the second metal layer is greater than a thickness of the third metal layer.

10. The method of claim 1, wherein the second metal layer comprises a material identical to a material forming the third metal layer.

11. A method comprising:
    forming an interlayer dielectric layer including a via hole over a semiconductor subtrate;
    depositing a first metal layer in the via hole and on sidewalls of the interlayer dielectric layer;
    forming spacers in the via hole and covering a lower portion of the sidewalls of the interlayer dielectric layer by etching back the first metal layer exposing a portion of the sidewalls of the interlayer dielectric layer;
    forming a second metal layer over the spacers and the exposed portion of the sidewalls of the interlayer dielectric layer, thereby forming a barrier layer comprising the first and second metal layers; and
    filling at least an inner portion of the via hole with a conductive material.

12. The method of claim 11, wherein the conductive material comprises tungsten.

13. The method of claim 11, wherein the barrier layer comprises at least one of Ti, TiN, Ti/TiN, and Ti/Al/Ti.

14. The method of claim 11, further comprising, before forming the interlayer dielectric layer, forming a third metal layer on the semiconductor substrate, wherein forming the via hole is performed by selectively etching the interlayer dielectric, to expose the third metal layer.

15. A device comprising:
    a first metal layer formed over a substrate;
    an insulating layer formed on the first metal layer;
    via holes formed in the insulating layer exposing the first metal layer; and
    a barrier layer formed in the via hole, wherein the barrier layer comprises:
    spacers including a second metal layer formed in the via hole and in contact with a portion of the insulating layer and the exposed first metal layer; and
    a third metal layer formed in the via hole and over the first and second metal layers.

16. The device of claim 15, further comprising a conductive material formed over the barrier layer, wherein the conductive material comprises tungsten.

17. The device of claim 16, wherein the conductive material is deposited through chemical vapor deposition.

18. The device of claim 15, wherein a thickness of the lower edge of the barrier layer is greater than a thickness of the upper edge of the barrier layer.

19. The device of claim 15, wherein a thickness of the spacers is 50 Å or less.

20. The device of claim 15, wherein a thickness of the second metal layer is in a range of 100 Å to 350 Å.

21. The device of claim 15, wherein the spacers comprise a material identical to a material forming the second metal layer.

* * * * *